Figure 1:
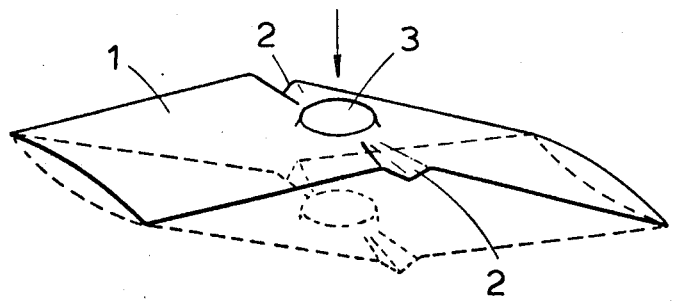

United States Patent [19]

Fanshawe

[11] 3,976,899

[45] Aug. 24, 1976

[54] SNAP ACTION MECHANICAL-ELECTRICAL PIEZOELECTRIC TRANSDUCER

[75] Inventor: David Geoffrey James Fanshawe, Redhill, England

[73] Assignee: U.S. Philips Corporation, New York, N.Y.

[22] Filed: Dec. 23, 1974

[21] Appl. No.: 535,995

Related U.S. Application Data

[63] Continuation of Ser. No. 422,671, Dec. 7, 1973, abandoned.

[30] Foreign Application Priority Data

Jan. 4, 1973 United Kingdom.................. 563/73

[52] U.S. Cl. ................................ 310/8.3; 310/8.5; 310/9.1; 340/365 E
[51] Int. Cl.² ........................................ H01L 41/04
[58] Field of Search ............... 310/8.3, 8.5, 8.6, 8.7, 310/9.1, 9.4; 340/365 E; 200/67 A, 67 D, 67 DA, 67 DB, 181

[56] References Cited

UNITED STATES PATENTS

| | | | |
|---|---|---|---|
| 3,076,071 | 1/1963 | Montag............................. | 200/67 D |
| 3,240,893 | 3/1966 | Farrell ............................. | 200/67 D |
| 3,353,038 | 11/1967 | Mason .................................. | 310/8.3 |
| 3,366,808 | 1/1968 | Steward ..................... | 310/8.3 |
| 3,464,531 | 9/1969 | Herr et al. ...................... | 310/9.1 X |
| 3,586,888 | 6/1971 | Dorfman............................. | 310/8.3 |
| 3,699,296 | 10/1972 | Harris............................. | 200/67 DB |
| 3,800,104 | 3/1974 | Lien et al. ..................... | 200/67 DA |

FOREIGN PATENTS OR APPLICATIONS 1,812,021 8/1969 Germany ............................ 310/8.3

*Primary Examiner*—Mark O. Budd
*Attorney, Agent, or Firm*—Frank R. Trifari; David R. Treacy

[57] ABSTRACT

A mechanical-electrical transducer producing an electric signal upon depression of a spring, such as a pushbutton. A piezoelectric element is held in contact with a snap-action spring, and bends when the spring snaps thus producing an electric signal.

6 Claims, 12 Drawing Figures

SNAP ACTION MECHANICAL-ELECTRICAL PIEZOELECTRIC TRANSDUCER

This is a continuation, of application Ser. No. 422,671, filed Dec. 7, 1973, now abandoned.

This invention relates to mechanical-electrical transducers and more particularly, though not exclusively, to manually-operable transducers.

Such transducers are used, for example, for manually feeding information into digital signalling or processing systems, the interface between the operator and the system typically comprising a plurality of push-buttons each representing an alphanumeric character. Operation of a push-button causes one or more pairs of electrical contacts to be made or broken in order to pass an appropriate electrical signal to the system.

In order to prevent misoperation due to various causes, the design specification for push-button-type transducers is fairly stringent in its requirements. Thus, for example, to prevent false operation of an intermediate push-button when the operator's finger is moving rapidly from one push-button to another, a minimum operating force (e.g. 200 grams) is specified. To prevent operator strain under continuous use conditions, the contacts must operate below a given maximum force (e.g. 440 grams). Further, the contact pairs must remain operated with a reduced force (e.g. 285 grams) and must release when the force reduces to a lower value (e.g. 70 grams). Also, to ensure that the push-button fully operates the contact pairs on each operation, it is required that the push-button exhibit a pronounced collapsing, or "give", action during operation. To provide this, the operating force is required to reach its maximum value after a given travel (e.g. 2 mm) of the push button and then suddenly reduce by a minimum amount (e.g. 50 grams). This collapsing action provides the operator with a positive indication that the signal has been transmitted successfully and also ensures that once the collapsing point has been reached, the push-button will then continue to travel over its full range of movement. To prevent too much variation in operating forces from push-button to push-button, a maximum operating force deviation (e.g. 120 grams) over all the push-buttons in a keyboard is specified. Lastly, a maximum (e.g. 2.7 mm) and a minimum (e.g. 0.25 mm) push-button travel is specified.

These requirements are complex and onerous. Push-button type transducers which meet this specification are therefore expensive. Also, due to the need for operating electrical contact springs, a considerable amount of space is required below each push button.

In another known type of transducer, generally known as a "touch button," two electrical terminals are arranged close together flush with the surface of an electrically insulating plate. The electrical impedance between the two terminals is normally very high - typically in the order of several hundred megohms. when the tip of an operator's finger is moved into contact with both terminals, the impedance between the terminals is reduced to the order of 30,000 to 60,000 ohms. This reduction in impedance is sensed by a high input resistance type detector (e.g. a field-effect transistor) and the detector then provides an appropriate electrical signal. Since no moving parts are involved, such transducers do not meet the stringent requirements of the push-button type and are hence cheaper and more compact. Since they give no positive indication to the operator that an electrical signal has been transmitted, however, they are generally only used in systems requiring less operational accuracy, such as for operating passenger and/or freight elevators. If a positive indication is required, it is usual to provide a lamp associated with each transducer. This leads to an increase in cost and size but such devices are still not suited to systems where the transducers are operated in rapid succession, for example in push-button dialling telephone instruments, teleprinters, computer keyboards, etc.. It is to be understood that such touch button devices, although having no moving parts, are to be considered as mechanical-electrical transducers for the present purposes in that their operation depends upon movement of the operator's fingers into mechanical contact with the terminals.

Yet another requirement for such transducers exists, for example, in the so-called "key-pads" for pocket calcuators. Here, the most important requirement is that the key pad must be as shallow as possible — preferably less than 5 mm. A known form of such a pad comprises a matrix of flat electrically-conducting plates covered with a sheet of electrically-conducting resilient material which exhibits a greatly reduced electrically resistivity when it is compressed. A rigid sheet, having cut-outs corresponding to the positions of the plates, is pressed against the resilient sheet on the side thereof opposite to the plates. The resilient sheet and each of the plates is provided with a respective electrical connection thereto. Suitable alphanumeric characters are printed on the surface of the resilient sheet exposed through the cut-outs or a separate printed sheet is provided between the resilient sheet and the rigid sheet. To operate the device, finger-pressure is applied to the resilient sheet through the appropriate cut-out and this compresses that part of the sheet in electrical contact with the appropriate pair of plates, so providing a low resistance path between them. Such known devices are very cheap and can be made very shallow, e.g. 3 mm. However, they suffer from the disadvantage that the resistance of the electrical contact between the sheet and any plate is variable and indeterminate and that no positive indication of satisfactory operation is given to the operator.

The object of the invention is the provision of a mechanical-electrical transducer which readily satisfies any of the above-mentioned requirements for the various forms of transducer and which at least considerably reduces the various above-mentioned disadvantages.

According to the invention a mechanical-electrical transducer comprises a monostable snap-action spring device having a portion which is mechanically distorted on snap-action of the device, and a piezoelectric element located in mechanical contact with said portion such that distortion of said portion causes the piezoelectric element to suffer mechanical distortion and hence to generate an electrical output.

Figure 2:
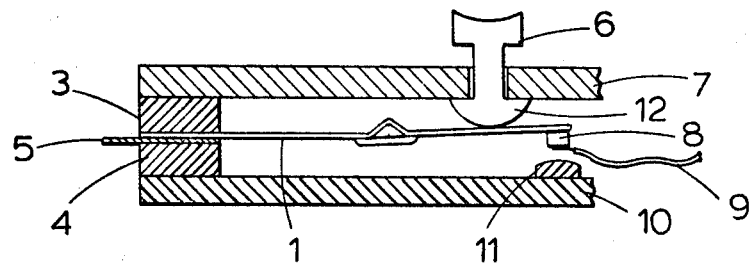
Figures 3A, 3B:
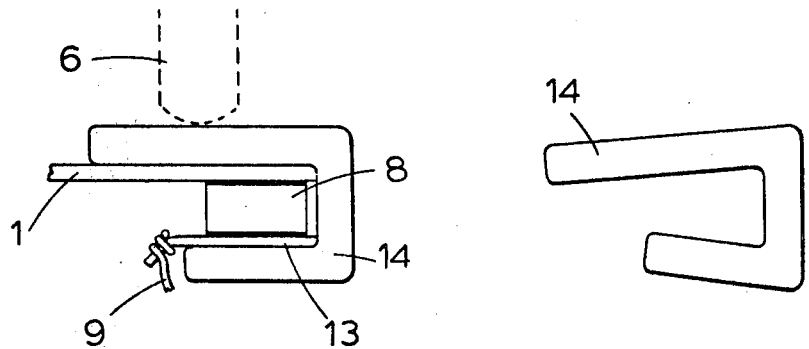
Figure 4:
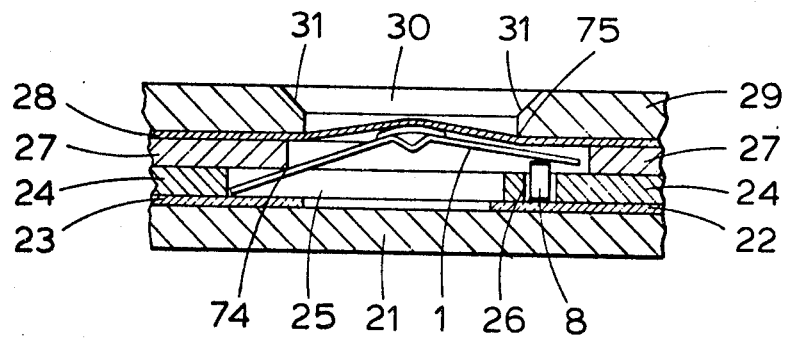
Figure 5:
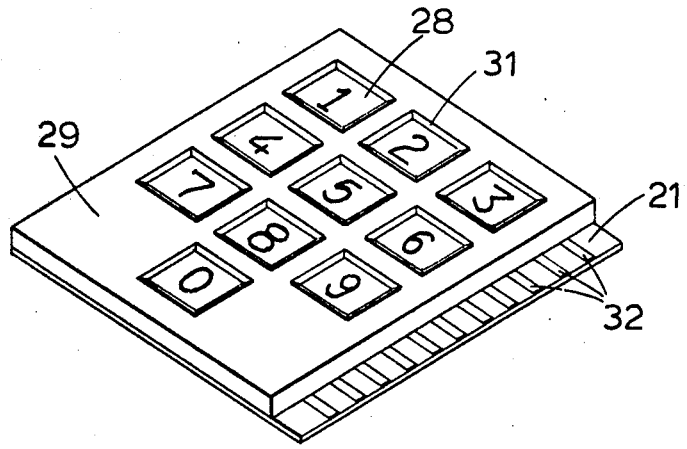
Figure 6:
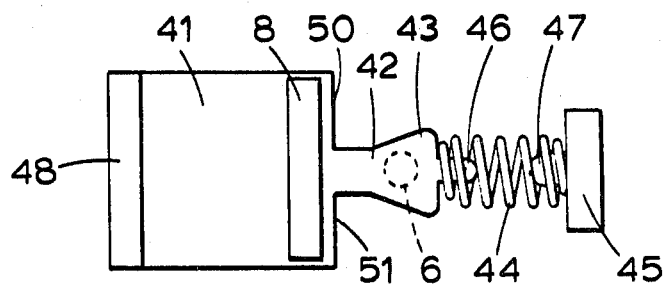
Figure 7:
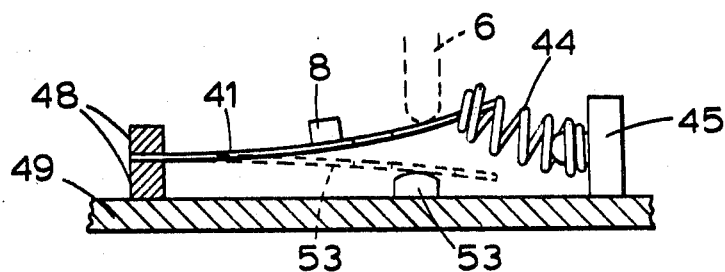
Figure 8:
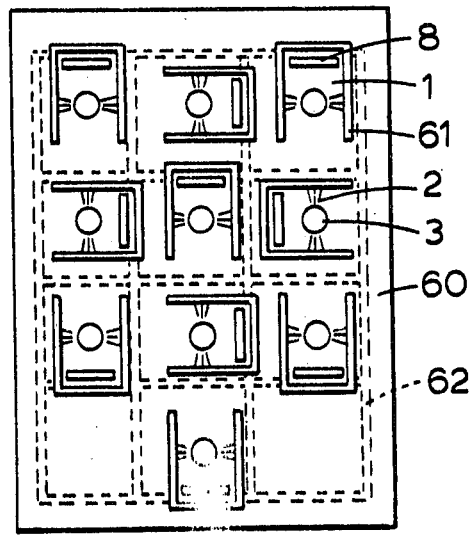
Figure 9:
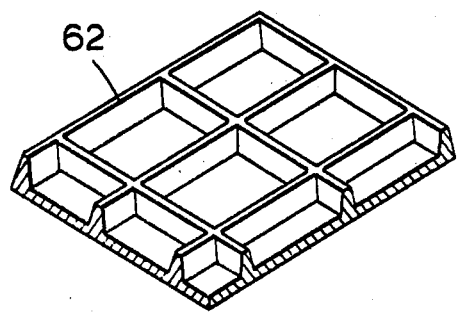
Figure 10A:
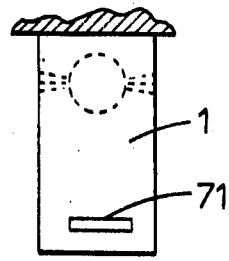
Figure 10A:
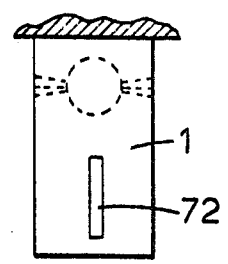
Figure 10A:
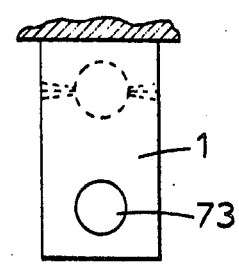
Figure 10A:
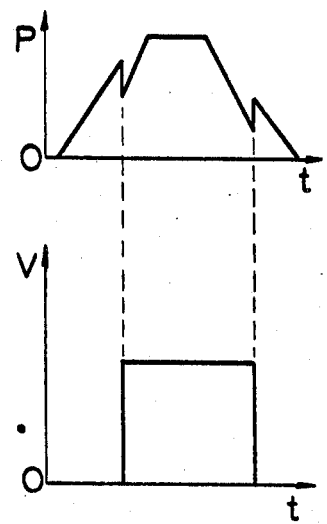
Figure 10B:
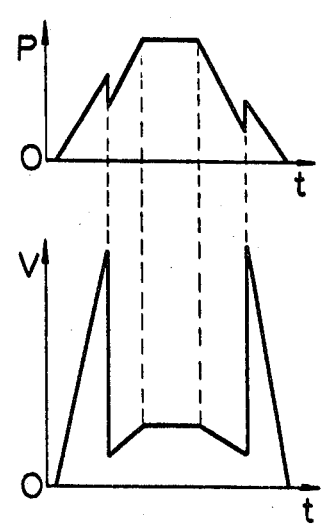
Figure 10C:
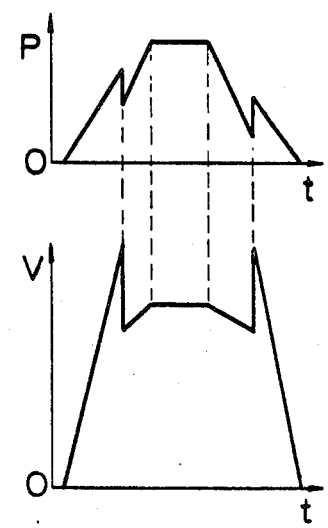
Figure 11A:
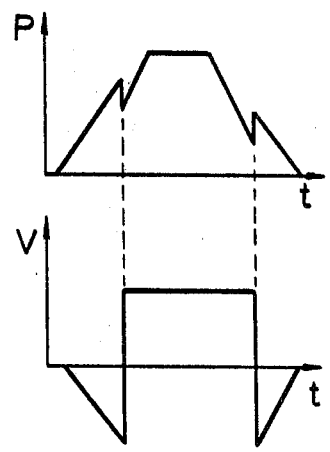
Figure 11B:
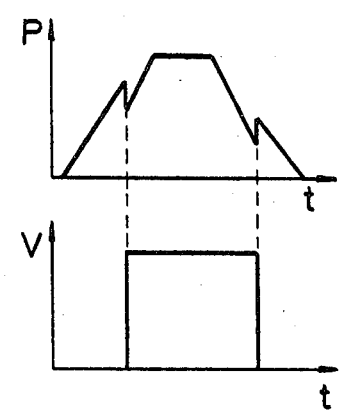

The various features and advantages of the invention will be apparent from the following description of exemplary embodiments thereof, taken in conjunction with the accompanying drawings, of which;

FIG. 1 is a diagrammatic view of one known form of snap-action monostable spring arrangement, FIG. 2 is a sectional view of a transducer according to the invention using a spring of the type shown in FIG. 1, FIGS. 3a and 3b are side view of clip means for maintaining a piezoelectric element in contact with a snap-action spring, FIG. 4 is a sectional view of another embodiment of a transducer according to the invention, FIG. 5 is a perspective view of a multi-transducer key pad using transducers of the type shown in FIG. 4, FIGS. 6 and 7 are plan and sectional views of a further embodiment of a transducer according to the invention, FIG. 8 is a plan view of a pluralitiy of snap-action springs formed from a single sheet of material, FIG. 9 is a perspective view of a support structure for the sheet shown in FIG. 8, FIGS. 10a, 10b, and 10c are graphs of input pressure and output voltage waveforms for various versions of the transducer shown in Fig. 2, FIGS. 11a and 11b are graphs of pressure input and voltage output waveforms for two versions of the transducer shown in FIG. 4, and FIGS. 12a, 12b, and 12c are partial sectional views of the transducer versions for which waveforms are shown in FIGS. 10a, 10b 10c.

Referring to FIG. 1, a blade spring 1 is deformed by a pressing operation so as to provide two V-shaped flutes 2 and a generally domed portion 3. In the pressing operation, the spring is provided with a slight bend at the flutes and the ends adopt slight bows, shown in the figure on an exaggerated scale for purposes of clarity. If the corners of the spring are supported and pressure is applied in the central region of the spring in the direction of the arrow, as the pressure increases, the spring suddenly "gives" and snaps over to the distorted shape shown in broken lines. On release of the pressure below a given level, the spring snaps back to its original shape, thus providing a monostable action. It can be seen from the figure that the bows in the ends of the spring invert.

These springs, though not generally used in the mechanical or electrical fields are nevertheless widely known in the toy field where they are used as noise-generating devices, or "clickers" usually being fixed at one end in a metal bowl which acts as a sound amplifier.

FIG. 2 shows such a spring arrangement 1 used in a push-button-type transducer according to the invention.

Spring 1 is clamped between two clamping blocks 4 in electrical contact with a terminal plate 5 by means of which electrical connection may be made with the spring. A push-button 6, mounted in a plate 7 fixed to clamping block 3, acts on the free end of the spring 1 such that pressure on the push-button causes the spring to snap to its quasi-stable condition. A flexure mode transducer is formed by firmly securing a piezoelectric element 8 to the free end of spring 1, e.g. by bonding with epoxy resin, or by soldering, such that one electrode of the element 8 is in electrical contact with the spring. A flexible lead wire 9 is bonded or soldered to the other electrode of element 8. On pressing button 6 such that spring 1 snaps over to its quasi-stable state, the distortion at the free end of spring 1 flexes the element 8 which therefore generates an electrical signal.

If one considers a longitudinal section through the centre of the leaf spring shown in FIG. 1 and mounted at one end as in FIG. 2, it is found that this is progressively bowed by pressure on the push button. A piezoelectric element in mechanical contact with this surface would thus suffer a gradual distortion and thereby generate a proportionate voltage. If one considers a transverse section near the free end of the spring it is found that this is bowed due to the initial forming of the spring, and that the magnitude of this bowing is substantially constant while the pressure of the push button is bending the spring longitudinally, until that point is reached at which the bow of the transverse section inverts into its quasi-stable state. In most cases it is desirable that a switch should give no output during the initial part of the travel of the push-button, and should generate its full output at a set point near the end of its travel irrespective of the speed at which the button is pressed (i.e., the output voltage should have a step waveform); furthermore, this point should correspond with the point at which the operating pressure reduces due to the collapsing action.

This effect is achieved by making the piezoelectric element sensitive to bending in the transverse direction of the spring, but not sensitive to bending in its longitudinal direction. This condition is obtained when a piezoelectric element of rectangular plan with a large length to width ratio is mounted transversely on the spring.

A description of piezoelectric elements of various types is given in the Philips Application Book "Piezoelectric Ceramics."

Preferably, piezoelectric element 8 is in the form of a thin rectangular plate; however a strip of so-called multimorph element, such as Mullard Multimorph PXE Type Number MB 8001 can also be used. It will, however, be obvious to those skilled in the art that other forms of elements, such as rods, discs, or tubes, may be used and also that different polarization directions of the element may be used according to the method chosen for transferring distortion of the spring to the element.

It has been found that the free end of the spring tends to oscillate immediately following the snap action which superimposes corresponding electrical oscillations on the electrical output voltage. In applications where such oscillations may prove troublesome (e.g. by causing multiple triggering of the associated electronic circuit) mechanical damping is advisable. This may be done by providing on a baseboard 10 a pad 11 of energy-absorbing resilient material, such as a silicone or butyl rubber, below the free end of the spring; the block 4 being fixed to the baseboard to provide a rigid assembly. A suitable clearance is left between the pad and the free end of the spring with the latter in its stable (normal) state such that the free end impinges on the block after the snap action and is pressed on to the block by the push-button. Additionally or alternatively, the domed end 12 of push-button 6 may be made of resilient energy-absorbing material.

The function of damping the oscillation and fixing and maintaining the piezoelectric element in contact with the spring may be combined in the very simple manner shown in FIGS. 3a and 3b. One electrode of element 8 is pressed into contact with the free end of spring 1, and the other electrode of element 8 is pressed into contact with a conducting metal plate 13 to which wire 9 is connected, by a clamping piece 14 of resilient material having a J-shaped cross section. In this case the piezoelectric element 8, not being firmly secured to the spring 1, must be inherently sensitive to a bending force. This necessitates the use of a double-layer piezoelectric element such as "multimorph" or "bimorph" element. In these structures the polarization directions in each layer are opposed so that when the element is bowed, the differential strain in the two layers results in an electrical output. Clamping piece 14 may be manufactured, for example from nylon or a flexible plastic material by the continuous extrusion process and by cutting into strips of the appropriate length. In its unstressed state, the two facing limbs of the clamping piece have a wedge-shaped gap as shown in FIG. 3b, the two limbs being forced apart to provide the clamping action. The upper limb of the clamping piece, as viewed in FIg. 3a, is longer than the lower limb in order to provide a land area for push-button 6 (represented by a broken outline). Alternatively this area may be contacted directly by the operator's finger without the intermediary of, or necessity for, the push-button. This method of assembly eliminates the need for soldering the electrodes of the piezoelectric element and also provides a very simple and rapid assembly of the device. This enables a very cheap device to be produced. The various force and dimensional requirements specified for a typical push-button type of transducer referred to in the introduction are all readily met by a spring assembly of the type described in relation to FIG. 1. In fact, the Applicants found that, with suitable choice of clamping point for the spring 1 and operating point of the push-button on the spring 1, springs taken from toy "clickers" all fully met the specification figures given by way of example in the introduction, this specification being the currently specified requirements for a push-button-dialling telephone instrument key pad.

An embodiment of the invention which provides a very shallow key pad, for example for use in pocket calculators, is illustrated in FIG. 4 which shows a single transducer of a multiple transducer pad. A printed wiring baseboard 21 is provided with two electrically isolated printed wiring layers 22 and 23. Against the printed wiring layers is an electrically insulating board 24 provided with two rectangular cut-outs 25 and 26. A piezoelectric element 8 rests in slot 26 with one electrode in contact with printed wiring layer 22. One end of a monostable snap-action spring 1 rests against the other electrode of element 8 and the other end of spring 1 bears on the left hand edge of slot 25 and against printed wiring layer 23. In this way, an electrical output generated by element 8 is available between wiring layer 22 and, via the spring 8, wiring layer 23. A spacer layer 27, having a rectangular cut-out to allow spring 1 to pass therethrough, is placed on board 24. Sandwiched between spacer layer 24 and a finger hole panel 29 is a diaphragm 28 of flexibly-resilient electrically insulating material. Panel 29 is provided with a cut-out 30 having chamfered edges 31. Spring 1 is retained in position by the left hand edge (as viewed in the Figure.) of the cut-out in board 24 bearing on the spring. This bearing action on the left-hand edge of spring 1 maintains the latter in good electrical contact with wiring layer 23. This action is further assisted by the diaphragm 28 bearing on the central portion of spring 1, this also serves to keep the right hand end of spring 1 bearing on the element 8, retaining the latter in position in slot 26 and maintaining good electrical contact between the element 8, wiring layer 22 and spring 1. Finger pressure applied to diaphragm 28—and hence spring 1—effects snap-action of the spring and the resulting distortion causes element 8 to generate an electrical output. The finger pressure applied to the center of the spring 1 will cause the piezoelectric element 8 to be squeezed between spring 1 and printed wiring layer 22. In addition, the piezoelectric element 8 will be bowed by pressure of the bowed end of spring 1 acting on its ends. When spring 1 snaps into its quasi-stable state and its bowed end consequently inverts, this applies pressure to the center of the piezoelectric element 8, thus causing it to bend in the same sense as spring 1. In order to ensure that a step output waveform is obtained from the transducer, it is necessary that the piezoelectric element 8 should be insensitive to the direct pressure which builds up before the spring snaps into its quasi-stable state and only sensitive to the bending action which occurs at that instant of inversion. This may be achieved by using a "multimorph" or "bimorph" type double-layer piezoelectric element. Under uniform compression, the two layers generate equal and opposite charges which cancel each other out. On bending, however, there is a differential distortion and a net output is obtained. The spring 1 is preloaded by the overlying structures 27, 28 and 29 to ensure that the spring remains in good electrical contact with the peizoelectric element 8 and the printed wiring layer 23, and also to ensure that the piezoelectric element is initially bowed by the spring 1 pressing on its ends.

Diaphragm 28 not only serves to prevent the ingress of moisture and dirt to the compartment occupied by spring 1 but also provides a surface on which alphanumeric characters may be printed. Alternatively, the characters may be printed on a separate sheet sandwiched between the diaphragm 28 and the finger hole panel 29.

In a multi-transducer key pad, the printed wiring board 21 may be arranged to project beyond a block formed by the sandwiched layers 24, 27, 28 and 29, and be provided with the edge connectors for enabling the pad to be connected to the associated circuitry. Thus, for example, in a ten-way key pad, printed wiring layer 23 may be connected to one end of each of the ten springs 1 and individual printed wiring layers 22 may be connected to the other end of each spring; so making a total of eleven edge connections. FIG. 5 shows such a key pad with eleven edge connections 32 on an extension of printed wiring board 21. The remaining designations are the same as those given in FIG. 4.

The various layers making up the complete assembly may be cemented together, e.g. by a thermo-setting epoxy resin adhesive, or riveted or bolted together; alternatively, one or more layers may be combined in a complex moulding in plastic or other suitable material. In FIG. 4, the vertical scale has been multiplied by about four times compared with the horizontal scale in order to show the detail more clearly. In a practical embodiment of a ten-key pad, of the type shown in FIG. 4 the overall depth of the pad was only 2.4 mm. Although the complete assembly was comparatively rigid, the use of a 1/32 inch glass fibre printed wiring board was found to give sufficient compliance over the area where the element 8 rests to enable the element to flex under the action of spring 1 and to give an adequate signal voltage output.

A multiple transducer key pad of the type described in relation to FIGS. 4 and 5 may, if required, be used for a push-button type key pad by suitably arranging an array of push buttons on a plate fixed to finger plate 29.

The monostable snap-action of the spring may be obtained in combination with an auxiliary spring in the well-known manner of, for example, microswitches. An embodiment employing such an arrangement is shown in outline in the drawings, in which FIG. 6 shows a plan view and FIG. 7 shows a side view of the embodiment. The two Figures are to be taken in combination for the purposes of the following description of the embodiment. A blade spring 41 is provided with an extension 42 having widened portions 43 against which one end of a compressed coil spring 44 abuts. The other end of the coil spring 44 abuts a rigid end member 45. Spigot 46 on extension 42 and spigot 47 on end member 45 retain the coil spring in position. The left-hand end of blade spring 41 as viewed in the Figures is rigidly held by two clamping blocks 48 mounted on a base-board 49 to which end member 45 is also fixed. A piezoelectric strip element 8 is maintained in contact with blade spring 41 across the shoulders thereof in any previously-described manner (not shown in FIG. 6 and 7). A push-button 6, shown in broken outline, bears against the widened portion of extension 42.

The action of coil spring 44 tends to force spring 41 in the upward direction, as viewed in FIG. 7, against push-button 6. Due to the shoulder edges 50, 51 of blade 41 being free, the center portion of spring 41 below element 8 is forced upward by the force acting in that area to a greater extent than the outer ends of the shoulders; thus imparting an upward bow in the spring in the region of element 8.

As the push-button is depressed, spring 44 is compressed further and increases the upward force tending to restore the push-button 6. When a position of the push-button is reached such that the two springs pass through their so-called "dead center" (a line joining the fixed ends of the two springs), the springs suddenly snap against a backstop 52 in known manner; the position now occupied by spring 41 is shown in broken outline at 53. The shoulders 50, 51 are now bowed in the opposite direction, and this distortion flexes element 8 and causes it to provide an electrical output. The electrical connections to element 8 are omitted from FIGS. 6 and 7 for the purposes of clarity.

Spring 41 and extension 42 are provided with a slight upward set, or bias, in the normal state shown in FIG. 7 such that, on release of push-button 6, the spring 41 returns to its normal position.

Instead of using individual springs of the type shown in FIG. 1 for each transducer in a multi-transducer key pad, all the springs can be provided in a single sheet of spring material in, for example, the manner shown in FIG. 8. A sheet of spring material 60 has 10 U-shaped slots 61 punched in it to form 10 springs 1. At the same time as punching out the slots, the flutes 2 and domes 3 of the springs are formed by a pressing operation. According to the material chosen for sheet 60, hardening may be required after punching and pressing to give the required spring characteristics. Piezoelectric strip elements 8 are then located on the free end of each individual spring and provided with electrical connections (not shown) in any of the ways previously described. In this particular embodiment, each end of each individual spring is supported by a partitioned support 62 of the general form shown in FIG. 9, the location of the partitions in relation to the springs being shown in broken lines in FIG. 8. By providing such a support and by arranging each spring at right angles to its neighbors in the manner shown in FIG. 8, the snap operation of any spring has no effect on any other spring.

Instead of mounting the piezoelectric elements 8 on top of each spring, they may alternatively be mounted beneath the springs, in the general manner shown in FIG. 4 in slots provided in a partitioned support similar to support 62.

Since the springs shown in the various figures all distort over the major part of their surface areas during their snap action, alternative positions can obviously be used for the piezoelectric element. Although the type of snap-action spring shown in FIGS. 1, 2, 4 and 8 is preferred due to its cheapness, compactness, and simplicity of assembly, there are many other forms of snap-action spring that could be used, of course. All that is required is that the spring shall have an area which suffers mechanical distortion during the snap action and that a piezoelectric element is located in contact with at least a portion of this area.

On operating the transducer according to the invention, the piezoelectric element generates an electric charge across a very high impedance source. If this source is connected to a circuit having a very high input impedance, such as a field effect transistor, the charge voltage remains substantially constant so long as the key is depressed. Thus the transducer gives an output comparable with that of a conventional spring contact type of push button key. When the operating force on the transducer is released, a reverse charge is developed which, in effect, cancels the initial charge and the output reverts to zero. According to the type of piezoelectric element chosen and its position on the spring, output voltages ranging from 5 to 40 volts have been obtained, i.e., they are suitable for working direct into integrated circuits.

If a pulse output is required, the piezoelectric element is loaded with a lower resistance value, for example with 10 megohms. Under this condition, an output voltage pulse was obtained having an exponential decay and which remained in excess of 5 volts for 5 to 10 milliseconds. On releasing the operating pressure from the transducer, an identical pulse was obtained with reverse polarity. If a short-duration single pulse is required each time the transducer is operated, the associated circuitry is arranged to accept a pulse of this polarity only.

If an output signal is required from the associated circuitry for the whole duration that a transducer is held in the operated state, and it is either not convenient or not possible to provide a very high input impedance, a bistable trigger circuit can be used which sets on receipt of the initial pulse of one polarity and rests on receipt of the following pulse of the opposite polarity.

FIGS. 10 and 11 show the effect of different configurations and mounting positions of the piezoelectric element on the spring 1.

FIGS. 10a, 10b, and 10c each show a snap-action spring 1 clamped in a block 4 and mounted in the cantilever manner shown in FIG. 2, each spring having a different piezoelectric element arrangement. Shown below each spring is a pressure/time waveform for pressure P applied to the spring, for example by the push button. It is assumed, for the purposes of clarity in the diagram, that the pressure is gradually increased to a maximum, maintained at this maximum for a period, and then slowly reduced. The kinks represent the collapsing action of the spring during the snap action in each direction. Below each pressure/time waveform is shown, on a cprresponding time scale, the voltage V output wavefore of the piezoelectric element assuming open-circuit output conditions (no charge leakage). In each case, the piezoelectric element is fixed over its whole contacting surface area to the spring, e.g. by soldering or glueing.

In FIG. 10a, a strip element 71 of piezoelectric material sensitive only to transverse strain is fixed transversely of the spring. In this condition, the element is only responsive to changes in the shape of the bowed end of the spring and not to bending of the spring along its length due to the applied pressure. The output waveform can be seen to be independent of rate of increase and decrease of applied pressure and a square wave voltage output is given. This is the preferred version.

In FIG. 10b, a strip element 72 of the same type as that used in FIG. 10a, is fixed longitudinally of the spring and is hence sensitive to the bending of the spring, this being clearly shown in the output waveform.

In FIG. 10c, a disc element 73 is used. This is sensitive to changes in both the bending and bowing of the spring and the output waveform is thus a combination of the outputs shown in FIGS. 10a and 10b.

FIGS. 11a and 11b show pressure input and voltage output waveforms for two transducers of the type shown in FIG. 4, i.e., in which the piezoelectric element is not bonded to the spring.

FIG. 11a shows the output voltage in the case where the bowed end of spring 1 of FIG. 4 just rests on the element 8 when no pressure is applied to the spring. As increasing pressure is applied, element 8 bows slightly in one direction and gives a commensurate output. On snap action of the spring, the bow in the spring is suddenly reversed, with the results that the output polarity of the element is also reversed and a steep-sided output is given as shown. The reverse effect occurs on release of the pressure. Such a transducer is suitable for feeding circuits which are only sensitive to one polarity such that a circuit only "sees" a single steep-sided pulse.

In a preferred embodiment as shown in FIG. 11b, spring 1 is pre-tensioned on to element 8 such that the latter is initially bowed to conform to the bow in the spring. In this case, the element only responds to the reversing of the bow on snap action of the spring, thus giving a square wave output with no polarity reversals. Referring to FIG. 4, the spring 1 is pre-tensioned on to element 8 by an edge 74 of spacer layer 27 bearing on the spring and/or by the downward pressure (as viewed in FIG. 4) of the resilient diaphragm 28 acting on the domed portion of the spring. Alternatively or in addition, an edge 75 of cut-out 30 in panel 29 may be arranged to press diaphragm 28 into pressure contact with the underlying portion of spring 1 such that pressure is applied to the spring in the region of the element 8.

It is to be noted that the output voltages shown are qualitative and not quantitative. Thus, for example, the measured maximum voltage in FIG. 11a is about 2 volts whereas that in the preferred embodiment of FIG. 11b is about 40 volts.

From the foregoing, it can readily be appreciated that a transducer according to the invention can be used in place of any of the previously-known devices and at least mitigates all of the aforedescribed disadvantages associated with the known devices.

Although the foregoing description relates to a single-output transducer, it is obvious that a multi-output transducer can be obtained by locating a plurality of piezoelectric elements on the spring, thus providing the equivalent of a multi-pole electric switch.

What we claim is:

1. A mechanical-electrical transducer comprising a monostable snap action spring formed from a sheet of material of the type which snaps from a first shape to a second shape along one dimension upon application of at least a given force to the spring, and a piezoelectric element; in the absence of force applied to the spring, a portion of the spring extending transverse to said one dimension being bowed transverse to said dimension, said bow being substantially constant upon application of force less than said given force to the spring; upon said spring snapping along said one dimension, said bow changing to a transverse bow in an opposite direction; and piezoelectric means for sensing change of said direction of said transverse bow only, said means comprising said piezoelectric element and means for holding said piezoelectric element in contact with said transverse portion of said spring.

2. A transducer as claimed in claim 1, wherein said first dimension extends longitudinally of said sheet of material, said spring being symmetrical about a longitudinal plane, and adapted to snap upon application of said given force along a direction lying in said plane, said transverse portion being substantially perpendicular to said plane.

3. A transducer as claimed in claim 2, wherein said piezoelectric element is elongated in said transverse direction.

4. A transducer as claimed in claim 1, wherein said means for holding comprises a material bonding said element to said spring.

5. A transducer as claimed in claim 1, wherein said means for holding comprises a resilient clamping member extending transverse to said dimension.

6. A mechanical electrical transducer comprising a blade spring adapted for flexure along one dimension from a first position to a second position, said blade spring having a snap action at a point intermediate said two positions and having a portion bowed transversely to said dimension, the direction of said transverse bow reversing upon said snap action, a piezoelectric element, and means for holding said piezoelectric element in contact with said bowed portion, said piezoelectric element being responsive solely to reversal of the bow direction for generation of an output voltage.

* * * * *